US008592616B2

(12) United States Patent
Molard et al.

(10) Patent No.: US 8,592,616 B2
(45) Date of Patent: Nov. 26, 2013

(54) LUMINESCENT HYBRID LIQUID CRYSTAL

(75) Inventors: Yann Molard, Acigné (FR); Stéphane Cordier, Plelan le Petit (FR); Maria de los Angeles Amela Cortes, Acigné (FR); Frédérick Dorson, Elancourt (FR)

(73) Assignees: Université de Rennes 1, Cedex (FR); C.N.R.S., Paris (FR)

( * ) Notice: Subject to any disclaimer, the term of this patent is extended or adjusted under 35 U.S.C. 154(b) by 128 days.

(21) Appl. No.: 12/952,345

(22) Filed: Nov. 23, 2010

(65) Prior Publication Data

US 2011/0130565 A1    Jun. 2, 2011

Related U.S. Application Data

(60) Provisional application No. 61/264,888, filed on Nov. 30, 2009.

(51) Int. Cl.
*C07F 11/00* (2006.01)
*H01L 51/50* (2006.01)

(52) U.S. Cl.
USPC ............................................ 556/57; 313/504

(58) Field of Classification Search
USPC ........ 562/405, 45; 568/716; 313/504; 556/57
See application file for complete search history.

(56) References Cited

FOREIGN PATENT DOCUMENTS

WO        2009040551        3/2011

OTHER PUBLICATIONS

Bellefon, C. et al.: Multiple bonds between main-group elements and transition metals. Organometallics, vol. 11, pp. 1072-1081, 1992.*
Zeijden, A. et al.: Reduction of aldehydes and ketones by transition-metal hydrides. Organometallics, vol. 11, pp. 2051-2057, 1992.*
Dorson, et al., "Selective functionalisation of Re6 cluster anionic units: from hexa-hydrox . . . "; The Royal Society of Chemistry 2009; Dalton Transactions, Jan. 8, 2009; pp. 1297-1299.
Kirakci, et al., "Synthesis and Characterization of . . . "; Z. Anorg, Allg. Chem 2005, 631; 2005 Wiley-Vch Verlag GmbH 7 Co KGaA; Rennes/France, Institut de Chimie De Rennes; pp. 411-416.
Long, et al., "A solid-state route to molecular Clusters"; Dept of Chemistry, Harvard University, Cambridge, MA 02138: J. Am. Chem. Soc. 1996, 118; Jan. 22, 1996, pp. 4603-4616.
Zietlow, et al., "Photophysics and Electrochemistry of Hexanuclar Tungsten Halide Cluster"; 1986 American Chemical Society; Inorganic Chemistry, vol. 25, No. 9; pp. 1351-1353.

* cited by examiner

*Primary Examiner* — Charanjit Aulakh
(74) *Attorney, Agent, or Firm* — Thomas Horstemeyer, LLP

(57) ABSTRACT

Embodiments of the present disclosure include compounds including a $M_6$ based cluster core with luminescent properties, methods for producing these compounds, as well as to luminescent materials with liquid crystalline properties including these compounds.

15 Claims, 7 Drawing Sheets

| Compound | Transition | T [°C] | ΔH [kJ.mol-1] |
|---|---|---|---|
| (nBu$_4$N)$_2$[Mo$_6$Br$_8$L$^{2a}{}_6$] | G →SmX | 20.8 | - |
| | SmX →N | 82.4 | 1.05 |
| | N →I | 94.0 | 4.19 |
| (nBu$_4$N)$_2$[Mo$_6$Br$_8$L$^{2b}{}_6$] | G →SmX | 20 | - |
| | SmX →I | 103 | 24.3 |

Figure 5

LUMINESCENT HYBRID LIQUID CRYSTAL

CROSS-REFERENCE TO RELATED APPLICATION

This application claims priority to U.S. provisional application entitled "Luminescent Hybrid Liquid Crystal," having Ser. No. 61/264,888 filed on Nov. 30, 2009, which is entirely incorporated herein by reference.

BACKGROUND

In recent years, the growing awareness of the merits to use renewable energies, but also the high oil prices, have lead to a new approach in the use of liquid crystal materials. One main application of liquid crystal materials is their application in LCD screens. This very well-known technology is based on the construction of cells containing liquid crystals. However, the imperative use of dichroic filter polarization and absorbent filters in the construction of cells causes a substantial loss of light intensity and implies a high consumption of electricity.

In order to minimize this energy consumption, new technologies based on organic light emitting diodes (OLEDs) are currently used in the design of flat low-power displays. They are based on luminescent organic compounds that are introduced into devices in an amorphous state by spin coating or vacuum deposition. Their main advantages over LCDs are that their luminescence properties make the use of polarizers, backlight or filters unnecessary and that tailored flexible displays can be designed.

Three basic colors are needed in order to obtain every color of the visible light spectrum: red, green and blue. It is well known that many organic compounds, inorganic, or hybrid organic-inorganic compounds are able to deliver effectively in the green and blue area of the spectrum, but only very few compounds are able to deliver effectively in the 550-950 nm area (red and near infrared). Well known in the prior art are, for example, Lanthanide-based organometallic complexes, that are interesting due to their fine band of emission. However, their light absorption is weak, which is a major disadvantage for applications, as the photoluminescence intensity is proportional to the amount of adsorbed light. Furthermore, for the considered wavelength area (550-950 nm), the emission quantum yield of their luminescence is very low, with less than 0.1%. By contrast, the similarly well-known Platinum complexes, as described for example in WO2009/040551, have greater emission quantum yield, however, their production cost is very high.

It has been shown that Re based metal clusters show luminescence properties. Dorson, et al. (*Dalton Trans.*, 2009, 1279-1299, which is incorporated by reference for the corresponding discussion) discloses a high yield and simple preparation method of hexahydroxo-complexes based on a Rhenium and Selen or Sulfur containing metal cluster. The cluster has four ligands of p-tertbutylpyridine (TBP) bound, and the modified octahedral cluster is suitable for further functionalizing on the two remaining hydroxyl groups with, for example, gallic acid derivatives or other carboxylic acids. The $Re_6$ cluster derivative shows a high absorption in the UV region. The maximum of emission in the spectrum is at 720 nm.

It is well known in the field that many halides, chalcogenides, and chalcoh alogenides of Molybdenum or Tungsten contain octahedral clusters in which metallic atoms are held together by metal-metal bonds. The metallic octahedron is surrounded by eight face-capping and six terminal ligands to form a $[M_6Qi_8Qa_6]_2$-nano-sized unit (Q=chalcogen and/or halogen, i=inner, a=apical).

As shown by Kirakci, et al. (*Z. Anorg. Allg. Chem.* 2005, 631, 411, which is incorporated by reference for the corresponding discussion) and Long, et al. (*J. Am. Chem. Soc.* 1996, 118, 4603, which is incorporated by reference for the corresponding discussion) many routes afford soluble discrete $[M_6Q^i{}_8X^a{}_6]^{2-}$ units (X=halogen) that exhibit, either in the liquid or solid state, specific electronic, magnetic and photophysical properties related to the number of metallic electrons available for metal-metal bonds. It has been shown by various groups that they are, in particular, highly emissive in the red-NIR area with photoluminescence emission quantum yields up to 23% for Molybdenum based clusters and 39% for Tungsten based clusters (for Tungsten clusters, see for example Zietlow, Thomas C.; Nocera, Daniel G.; Gray, Harry B. *Photophysics and electrochemistry of hexanuclear tungsten halide clusters. Inorganic Chemistry* (1986), 25(9), 1351-3: $[(n-C_4H_9)_4N]_2$ $W_6I_8I_6$ quantum yield 0.39; λmax=698 nm; luminescence ranging from 550 to 950 nm). They, furthermore, display excited state lifetimes ranging from the tenth to the hundredth microseconds and undergo facile ground and excited state electron transfer by electrogenerated luminescence. Owing to the stronger covalent nature of the M-$Q^i$ bond compared to the M-$X^a$ one, halogen apical atoms can be replaced by inorganic or organic ligands without any alteration of the $(M_6Q^i{}_8)^{m+}$ core leading to functional building blocks usable for the design of supramolecular architectures, polymeric frameworks or nanomaterials with unique properties. Many examples of hexasubstituted $[M_6Q^i{}_8L^a{}_6]^{x-}$ units (L=ligand) have been reported so far. However, because of the nanometric size of the $(M_6Q^i{}_8)^{m+}$ core and the sensitivity of the $[M_6Q^i{}_8L^a{}_6]^{x-}$ units to air and moisture, their functionalization and use as liquid crystalline components in devices remain challenges. It requires air stable hybrid compounds with, on one hand, self organization abilities and, on the other hand, fluidity in order to correct automatically the positioning errors that can occur during the assembly process.

Thus, a need exists to address the above challenges.

SUMMARY

Embodiments of the present disclosure can include compounds comprising a $M_6$ based cluster core and at least one ligand. In a first embodiment of the present disclosure, the metal M is Molybdenum (Mo) or Tungsten (W). In another embodiment, the metal M is preferably Molybdenum (Mo).

The ligand according to an embodiment of the present disclosure is selected from the following compounds:

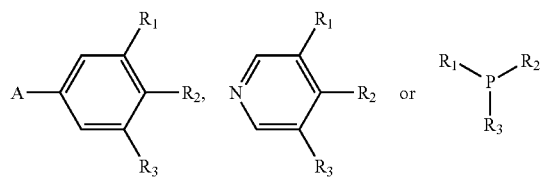

where A is selected from OH, COOH, or $SO_3H$, and where each of $R_1$, $R_2$ and $R_3$ are independently selected from a H atom, a straight or branched alkyl chain containing from 1 to 30 methylene groups, wherein one or more methylene groups in this alkyl chain is optionally replaced with —O—, —CO—, —S—, —CH=CH—, —C≡C—, —COO—, —OC(=O)—, —CH=N—, —N=CH—, —C(=O)NH— or —NH(C=O)— and the hydrogen atoms in this alkyl chain are optionally replaced with fluorine atoms or a $R_i$ group:

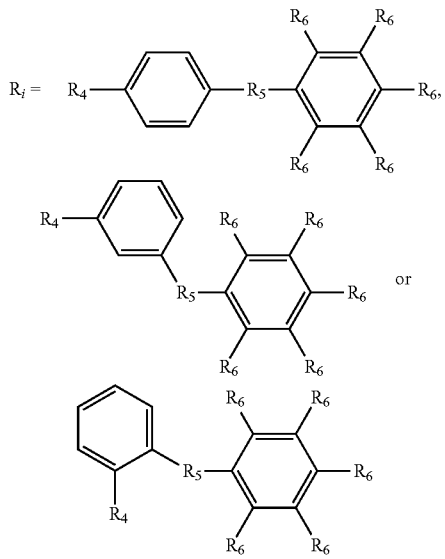

$R_4$ is a straight or branched alkyl chain containing from 1 to 30 methylene groups, wherein one or more methylene groups in this alkyl chain is optionally replaced with —O—, —CO—, —S—, —CH=CH— or —C≡C—, —COO—, —OC(=O)—, —CH=N—, —N=CH—, —C(=O)NH— or —NH(C=O)— and the hydrogen atoms in this alkyl chain are optionally replaced with a fluorine atom.

$R_5$ is a single bond, —C=C—, —C≡C—, a phenyl ring, —C=N—, —N=C—, —N=N—, —C(=O)O, —O(O=)C—, —C(=O)NH— or —NH(C=O)—.

$R_6$ is a hydrogen atom, a halogen atom, a —C≡N, a —$NO_2$, a straight or branched chiral or an achiral alkyl chain containing from 1 to 30 methylene groups, wherein one or more methylene in this alkyl chain is replaced with —O—, —CO—, —S—, —CH=CH—, —C≡C—, —COO—, —OC(=O)—, —CH=N—, —N=CH—, —C(=O)NH— or —NH(C=O)— and wherein the hydrogen atoms in this alkyl chain are optionally replaced with a fluorine atom.

Preferred are ligands including carboxylic acid compounds having the following formula:

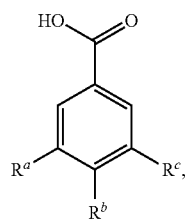

where $R^a$, $R^b$ and $R^c$ are

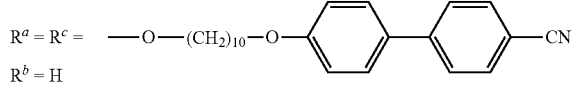

or, where $R^a$, $R^b$ and $R^c$ are

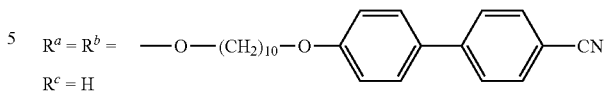

According to an embodiment of the present disclosure, the $M_6$ based cluster core is of the $Mo_6Q_8L_6$ type, wherein each M is independently selected from Mo or W, wherein each Q is independently selected from a halogen or a chalcogen, and L is a ligand.

Preferably, the compounds show a luminescence from about 550-950 nm. The luminescence maximum is more preferably located from about 700 nm to 745 nm.

The present disclosure furthermore relates to a method of producing the compounds of the first embodiment of the present disclosure. This method comprises a one step reaction of a metal cluster of the $M_6Q_8X_6$ type, wherein each M is Mo or W, wherein each Q is independently selected from a halogen or a chalcogen and X is a F, with ligands. In a preferred embodiment of the method, Q is selected from the group consisting of S, Se, Te, I, Cl, Br, and a mixture thereof. The method can be performed in ambient atmosphere, and the one step reaction of said method can be either performed in an aprotic polar solvent or in the melted ligand.

In a second embodiment, the present disclosure relates to a compound comprising a $M_6$ based cluster core, where M is Rhenium (Re) and at least one ligand. The ligand according to this embodiment of present disclosure is selected from the following compounds:

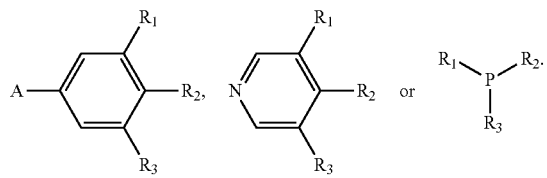

"A" is selected from OH, COOH, or $SO_3H$; and each of $R_1$, $R_2$ and $R_3$ are independently selected from a H atom, a straight or branched alkyl chain containing from 1 to 30 methylene groups, wherein one or more methylene groups in this alkyl chain may be replaced with —O—, —CO—, —S—, —CH=CH—, —C≡C—, —COO—, —OC(=O)—, —CH=N—, —N=CH—, —C(=O)NH— or —NH(C=O)— and the hydrogen atoms in this alkyl chain are optionally replaced with fluorine atoms or a Ri group:

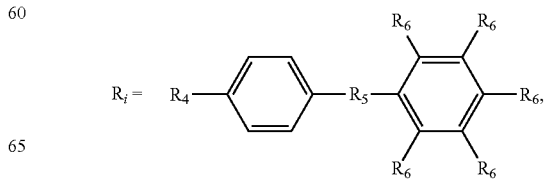

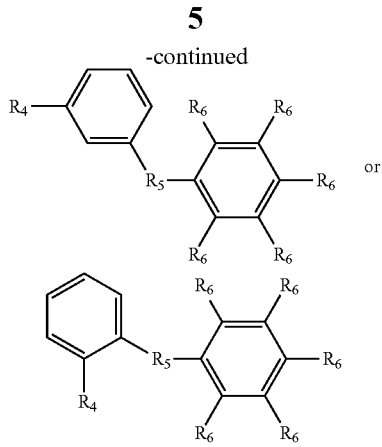

$R_4$ is a straight or branched alkyl chain containing from 1 to 30 methylene groups, wherein one or more methylene groups in this alkyl chain are optionally replaced with —O—, —CO—, —S—, —CH═CH— or —C≡C—, —COO—, —OC(═O)—, —CH═N—, —N═CH—, —C(═O)NH— or —NH(C═O)— and the hydrogen atoms in this alkyl chain are optionally replaced with a fluorine atom.

$R_5$ is a single bond, —C═C—, —C≡C—, a phenyl ring, —C═N—, —N═C—, —N═N—, —C(═O)O, —O(O═)C—, —C(═O)NH— or —NH(C═O)—. $R_6$ is either be a hydrogen atom, a halogen atom, a —C≡N, a —NO$_2$, a straight or branched chiral or an achiral alkyl chain containing from 1 to 30 methylene groups, wherein one or more methylene in this alkyl chain is replaced with —O—, —CO—, —S—, —CH═CH—, —C≡C—, —COO—, —OC (═O)—, —CH═N—, —N═CH—, —C(═O)NH— or —NH(C═O)— and wherein the hydrogen atoms in this alkyl chain is optionally replaced with a fluorine atom.

According to this embodiment of the present disclosure, the $M_6$ based cluster core is of the $Re_6Q_8L_6$ type, wherein each Q is independently selected from a halogen or chalcogen and L is a ligand. In a preferred version of this embodiment, the compounds show a luminescence from about 550-950 nm. The luminescence maximum is preferably located from about 700 nm to 745 nm.

The present disclosure furthermore relates to a method for producing the compounds of this embodiment of the present disclosure comprising a one step reaction of a metal cluster of the $Re_6Q_8X_6$ type, wherein each Q is independently selected from a halogen or chalcogen and X is a F, with ligands. Q is selected from the group consisting of S, Se, Te, I, Cl, Br, and a mixture thereof. The method is performed in ambient atmosphere, and the one step reaction is performed in an aprotic polar solvent or in the melted ligand.

The present disclosure furthermore relates to a luminescent material with liquid crystalline properties comprising the compounds according to the present disclosure, as described in the embodiments above. In one preferred embodiment of the present disclosure, the luminescent material with liquid crystal properties shows a luminescence from about 550-950 nm. The luminescence maximum is preferably located from about 700 nm to 745 nm.

Another feature of the present disclosure is the temperature range over which the material stays in the LC phase. In an especially advantageous embodiment of the present disclosure, the luminescent material with liquid crystal properties remains in the smectic phase in a temperature of about 20° C. to 82° C. and shows a nematic phase from about 82° C. and 94° C. This makes it suitable for a high range of appliances without altering its advantageous properties.

The luminescent material with liquid crystal properties can be used in various appliances such as, for example, polymeric matrix flat screens, LCD screens, photovoltaic cells, information storages, temperature detectors, gas sensors, electroluminescent diodes, LASERs, active waveguides, and field effect transistors.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 5 illustrates the phase behavior of $(nBu_4N)_2[Mo_6Br_8L^i{}_6]$ with i=2a, 2b.

DETAILED DESCRIPTION

Figure 1:
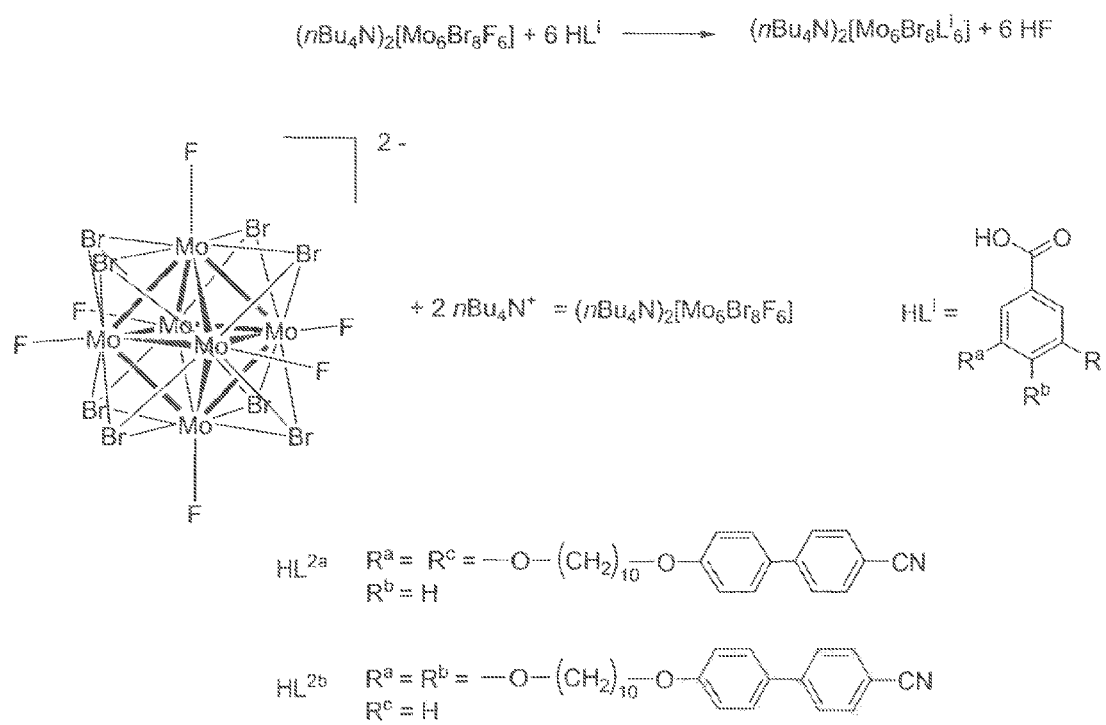
FIG. 1 illustrates the chemical structures of $(nBu_4N)_2[Mo_6Br_8F_6]$ and two gallic acid derivatives according to one embodiment of present disclosure.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DEFINITIONS

As used herein the term "liquid crystalline material" refers to a material that is formed of liquid crystals. Liquid crystals are materials with a structure that is intermediate between that of liquids and crystalline solids. As in liquids, the molecules of a liquid crystal can flow past one another. As in solid crystals, however, they arrange themselves in recognizably ordered patterns. In common with solid crystals, liquid crystals can exhibit polymorphism; i.e., they can take on different structural patterns.

As used herein the term "mesophase" refers to the various phases of liquid crystals.

As used herein the term "smectic phase" refers to an organizational structure form of a liquid crystal. The smectic phases form well-defined layers that can slide over one another and that are positionally ordered along one direction. There are many different smectic phases, all characterized by different types and degrees of positional and orientational order. For example, in the Smectic A phase, the molecules are oriented along the layer normal, while in the Smectic C phase they are tilted away from the layer normal. These phases are liquid-like within the layers. The smectic B phase is a translationally ordered phase (a two-dimensional hexagonal lattice in each smectic plane) with no orientational order. Accordingly, smectic liquid crystals arrange themselves in layered sheets; within different smectic phases the molecules may take on different alignments relative to the plane of the sheets.

As used herein the term "nematic phase" refers to an organizational structure form of a liquid crystal. The "nematic phase" is the most disordered liquid crystal phase where all molecules on average are oriented in the same direction but with no positional correlation.

As used herein the term "transition metal" refers to all elements from group 3 to 12 of the periodic table.

As used herein the term "emission quantum yield" refers to the ratio between the number of emitted photons and the number of adsorbed photons.

Discussion

The present disclosure relates to compounds comprising a $M_6$ based cluster core with luminescent properties, methods for producing said compounds, as well as to luminescent materials with liquid crystalline properties comprising said compounds. The integration of the $M_6Q_8$ (M=Mo, W, or Re; Q=halogen and/or chalcogen) cluster core into macroscopic devices by using a bottom-up approach has been shown in this disclosure.

Embodiments of the present disclosure include compounds comprising a $M_6$ based cluster core and at least one ligand. Suitable metal atoms according to the first embodiment of the present disclosure are Molybdenum (Mo) or Tungsten (W). Molybdenum (Mo) is preferred over Tungsten (W) because of the ease of synthesis of Molybdenum cluster compounds compared to Tungsten cluster compounds.

Suitable ligands according to this first embodiment are selected from the group described below:

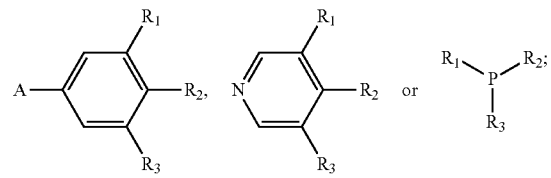

where A is selected from OH, COOH, or $SO_3H$, and where each of $R_1$, $R_2$ and $R_3$ are independently selected from a H atom, a straight or branched alkyl chain containing from 1 to 30 methylene groups, wherein one or more methylene groups in this alkyl chain is optionally replaced with —O—, —CO—, —S—, —CH═CH—, —C≡C—, —COO—, —OC(═O)—, —CH═N—, —N═CH—, —C(═O)NH— or —NH(C═O)— and the hydrogen atoms in this alkyl groups is optionally replaced with fluorine atoms or a $R_i$ group:

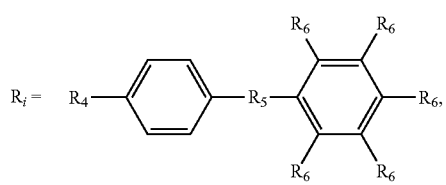

-continued

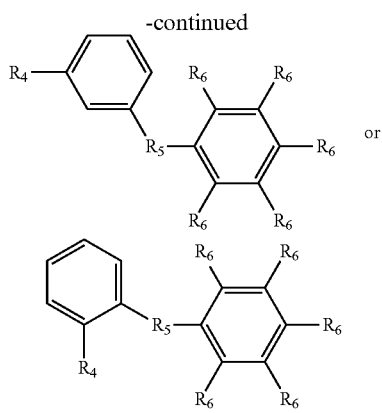

or $R_4$ is a straight or branched alkyl chain containing from 1 to 30 methylene groups, wherein one or more methylene groups in this alkyl chain is optionally replaced with —O—, —CO—, —S—, —CH=CH— or —C≡C—, —COO—, —OC(=O)—, —CH=N—, —N=CH—, —C(=O)NH— or —NH(C=O)— and the hydrogen atoms in this alkyl chain are optionally replaced with a fluorine atom.

$R_5$ is a single bond, —C=C—, —C≡C—, a phenyl ring, —C=N—, —N=C—, —N=N—, —C(=O)O, —O(O=)C—, —C(=O)NH— or —NH(C=O)—.

$R_6$ is a hydrogen atom, a halogen atom, a —C≡N, a —$NO_2$, a straight or branched chiral or an achiral alkyl chain containing from 1 to 30 methylene groups, wherein one or more methylene in this alkyl chain is replaced with —O—, —CO—, —S—, —CH=CH—, —C≡C—, —COO—, —OC(=O)—, —CH=N—, —N=CH—, —C(=O)NH— or —NH(C=O)— and wherein the hydrogen atoms in this alkyl is optionally replaced with a fluorine atom.

Especially preferred are ligands including carboxylic acid compounds having the following formula:

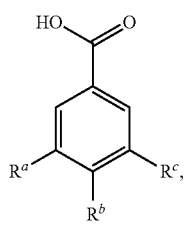

where $R^a$, $R^b$ and $R^c$ are

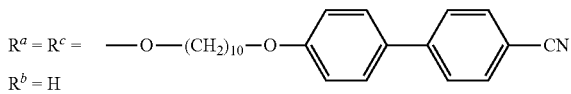

$R^a = R^c =$ —O—$(CH_2)_{10}$—O—⟨⟩—⟨⟩—CN
$R^b = H$ or, where $R^a$, $R^b$ and $R^c$ are

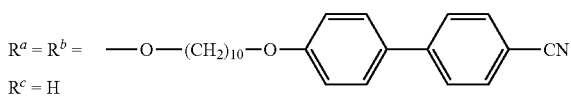

$R^a = R^b =$ —O—$(CH_2)_{10}$—O—⟨⟩—⟨⟩—CN
$R^c = H$

Those compounds have been chosen in this first embodiment of the present disclosure over other compounds due to their reactivity with a Mo cluster, or a W cluster containing F atoms as axial ligands and their high stability. They are preferred over other derivatives, like for example pyridine derivatives, because the grafting reaction is a one step quantitative reaction for which all reactants shall not be moisture sensitive. In contrast with previously described grafting reactions of carboxylic acid derivatives on cluster cores such as the work described by Shriver and Prokopuk (N. Prokopuk, D. F. Shriver, Inorg. Chem., 1997, 36, 5609-5613, which is incorporated by reference for the corresponding discussion) that is based on the exchange of methoxy groups with carboxylate, the cluster precursor $M_6Q_8F_6^{m-}$ is air stable and non-moisture sensitive, thus facilitating the ease of synthesis of the desired hybrid and thus reducing the production costs. Indeed, all manipulations are performed in an ambient atmosphere without using inert atmosphere drybox, high-vacuum manifold, or Schlenk techniques.

The use of pyridine derivatives as ligands has been described previously. However, it was demonstrated in previous works that a pyridine as an axial ligand connected to the cluster via N atom can switch off the luminescence of a $Mo_6X_8$ core (Rodrigo Ramirez-Taglea and Ramiro Arratia-Pérez, "Pyridine as axial ligand on the $[Mo_6 Cl_8]^{4+}$ core switches off luminescence", CHEMICAL PHYSICS LETTERS, 2009, 475, 4-6, 232-234). Contrary to that the luminescence properties of the cluster core with the use of the other ligands according to the present disclosure are kept intact. The use of pyridine derivative as ligands is therefore less preferred.

Another advantage of the use of the ligands according to the present disclosure is that they keep the composition more stable, as the total charge of the cluster is not modified by them.

In a preferred version of this first embodiment of the present disclosure, the $M_6$ cluster core is of the $M_6Q_8L_6$ type, wherein each M is independently selected from Mo or W, wherein each Q is independently selected from a halogen or chalcogen, and L is a ligand. Preferred is a Mo based cluster which has advantages over the use of a Re or W based clusters, such as for example better luminescence properties and lower cost of synthesis.

In a preferred version of this first embodiment, the core cluster of the present disclosure further comprises halogen atoms only. The preferred halogen atoms are Br, Cl and I, or a mixture of these three halogens. Use of only Halogen atoms in the core cluster is advantageous over using transition metal core clusters with Chalcogens/Halogens, as their synthesis is easier and the obtained material is more stable. Furthermore, these clusters show very good luminescence properties.

The present disclosure further encompasses a method for producing the compounds according to the first embodiment of the present disclosure comprising a one step reaction of a metal cluster of the $M_6Q_8X_6$ type, wherein each M is independently selected from Mo or W, each Q is independently selected from a halogen or a chalcogen and X is a F, with the ligands as described above. In a preferred embodiment, Q is selected from the group consisting of S, Se, Te, I, Cl, Br, and a mixture thereof. The advantage of the use of a Mo-Halogen, Mo-Halogen/Chalcogen or W-Halogen and W-Halogen/Chalcogen based clusters compared to other transition metal clusters is the ease of synthesis and the stability of the obtained material. Furthermore, these clusters show very good luminescence properties. Preferred are Mo-Halogen and W-Halogen based clusters.

The use of F as the apical anion in the cluster in this process provides the cluster with very high stability in contrast with clusters containing, for example, triflate or methoxy groups as apical ligands that are very air and moisture sensitive. Thus, all manipulations can be performed in an ambient atmosphere without using an inert atmosphere drybox, a high-vacuum manifold or Schlenk techniques, as it is usual for triflate or methoxy substituted clusters. Despite its stability, the cluster reacts surprisingly very easily with the carboxylic acid derivatives. The reaction can be realized in an aprotic polar solvent such as THF but can also take place in the melted organic ligand.

In a second embodiment, the present disclosure relates to a compound comprising a $M_6$ based cluster core, where M is Rhenium (Re) and at least one ligand.

The ligands according to this embodiment of present disclosure are selected from the following compounds:

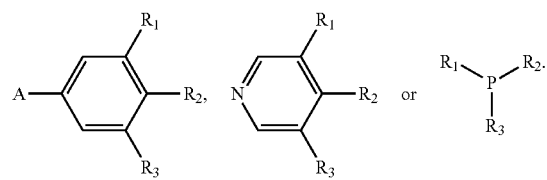

A is selected from OH, COOH, or $SO_3H$; and each of $R_1$, $R_2$ and $R_3$ are independently selected from a H atom, a straight or branched alkyl chain containing from 1 to 30 methylene groups, wherein one or more methylene groups in this alkyl chain is optionally replaced with —O—, —CO—, —S—, —CH═CH—, —C≡C—, —COO—, —OC(═O)—, —CH═N—, —N═CH—, —C(═O)NH— or —NH (C═O)— and the hydrogen atoms in this alkyl chain is optionally replaced with fluorine atoms or a Ri group:

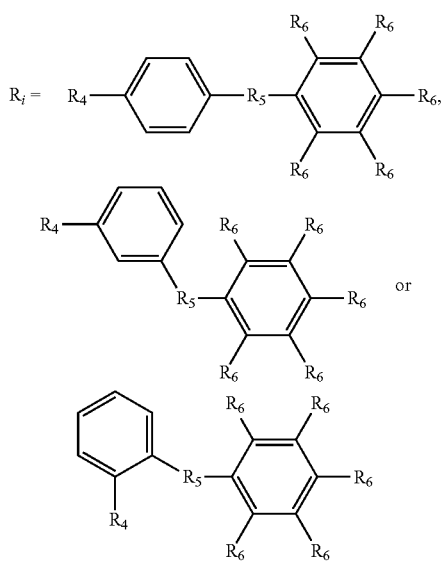

$R_4$ is a straight or branched alkyl chain containing from 1 to 30 methylene groups, wherein one or more methylene groups in this alkyl chain is optionally replaced with —O—, —CO—, —S—, —CH═CH— or —C≡C—, —COO—, —OC(═O)—, —CH═N—, —N═CH—, C(═O)NH— or —NH(C═O)— and the hydrogen atoms in this alkyl chain is optionally replaced with a fluorine atom.

$R_5$ is a single bond, —C═C—, —C≡C—, a phenyl ring, —C═N—, —N═C—, —N═N—, —C(═O)O, —O(O═) C—, —C(═O)NH— or —NH(C═O)—.

$R_6$ is a hydrogen atom, a halogen atom, a —C≡N, a —$NO_2$, a straight or branched chiral or an achiral alkyl chain containing from 1 to 30 methylene groups, wherein one or more methylene in this alkyl chain is replaced with —O—, —CO—, —S—, —CH═CH—, —C≡C—, —COO—, —OC(═O)—, —CH═N—, —N═CH—, —C(═O)NH— or —NH(C═O)— and wherein the hydrogen atoms in this alkyl chain is optionally replaced with a fluorine atom.

According to this embodiment of the present disclosure the $M_6$ based cluster core is of the $Re_6Q_8L_6$ type, wherein each Q is independently selected from a chalcogen or halogen, and L is a ligand.

The present disclosure furthermore relates to a method for producing the compounds of this embodiment of the present disclosure comprising a one step reaction of a metal cluster of the $Re_6Q_8X_6$ type, wherein each Q is independently selected from a halogen or chalcogen and X is a F, with ligands. Q is selected from the group consisting of S, Se, Te, I, Cl, Br, and a mixture thereof. The method is performed in ambient atmosphere, and the one step reaction is performed in an aprotic polar solvent (e.g., dimethyl sulfoxide, dimethylformamide, dioxane and hexamethylphosphorotriamide, tetrahydrofuran) or in the melted ligand.

It is well known that many organic compounds, inorganic or hybrid organic-inorganic compounds are able to deliver effectively in the green and blue, but only very few compounds are able to deliver effectively in the about 550 to 950 nm area (red and near infrared). Lanthanide-based organometallic complexes are interesting due to their fine band of emission in this area, but their emission quantum yield of luminescence is very low with less than 0.1% for the considered wavelength area. Platinum complexes have greater yields. However, their production cost is very high. One aim of the present disclosure is thus to overcome the disadvantages of the so far known complexes and to provide a luminescent material with liquid crystal properties that has a strong emission in the red and near infrared area and that is economically attractive.

In one embodiment of the present disclosure, the compounds according to the present disclosure are characterized in that the luminescence is from about 550-950 nm. In a preferred embodiment of the present disclosure, the luminescence maximum is located from about 700 nm to 745 nm.

The present disclosure furthermore provides for a luminescent material with liquid crystalline properties comprising a compound according to the present disclosure.

In one embodiment of the present disclosure, the luminescent material with liquid crystal properties according to the present disclosure is characterized in that the luminescence is about 550-950 nm. In a preferred embodiment of the present disclosure, the luminescence maximum is located from about 700 nm to 745 nm.

A feature for liquid crystal materials and their appliances is the temperature range in which said material remains in the liquid crystal phase. In an advantageous embodiment of the present disclosure, the luminescent material with liquid crystal properties remains in the smectic phase having a temperature of about 20° C. to 82° C. and shows a nematic phase from about 82° C. to 94° C. This makes it suitable for a high range of appliances without altering its properties.

The luminescent material with liquid crystal properties according to the present disclosure can be used in various appliances such as, for example, polymeric matrix flat screens, LCD screens, photovoltaic cells, information storages, temperature detectors, gas sensors, electroluminescent diodes, LASERs, active waveguides, and field effect transistors.

One advantage of octahedral molybdenum, tungsten, or rhenium clusters like the $Mo_6X_{14}$, $W_6X_{14}$, or $Re_6X_{14}$, type presented in this disclosure is their high photoluminescence quantum yield of up to about 23%, and even up to about 39%, and their large band of emission. In addition, unlike pure organic compounds, they are not sensitive to the phenomenon of photo-bleaching, which reduces efficiency of luminescence properties over time.

The luminescent material with liquid crystalline properties of the present disclosure will be the material of choice for producing flat screens with a polymeric matrix, since their luminescence properties and their long range organizational order lead to lower energy consumption compared to other solutions known in the art such as typical LCD displays that contain color filters, which implies the use of more powerful backlight to keep a good brightness, or OLEDs which are amorphous. Due to their lower energy consumption, these materials are well suited for mobile technologies.

Another advantageous feature of the luminescent material with liquid crystalline properties of the present disclosure is that due to the nature of the cluster, it is possible to modify the geometry and the chemical affinity of the obtained molecular assemblies. These changes will optimize the nanostructure of the molecular bricks and will allow drastic organizational changes in the macroscopic scale of such materials.

For example, the discotic character of some luminescent materials with liquid crystalline properties can find application in devices like photovoltaic cells due to their ability to organize themselves in mono-dimensional networks conducting electrons.

It is within the scope of the present disclosure to provide a hybrid material comprising a cluster showing liquid crystal properties as hereinbefore described in combination with one or several known liquid crystals without metal clusters. One of the advantages of such a system (LC+LC containing cluster) is that it is possible to reduce the amount of cluster needed to provide a LC luminescent material and to improve the fluidity of the obtained hybrid material. Also, the mixing of two different LC clusters to obtain a different LC behavior is envisaged.

The present disclosure may be better understood with reference to the following examples. These examples are intended to be representative of specific embodiments of the present disclosure, and are not intended as limiting the scope of the disclosure.

EXAMPLES

Example 1

Synthesis of the Nanometer-Sized $(nBU_4N)_2$ $[Mo_6Br_8F_6]$ Cluster Unit and Grafting of the Complex with Ligands The synthesis is a one step reaction of $[Mo_6Br_8F_6]$ units with carboxylic acid derivatives (FIG. 1). It results in the in situ exchange of apical $F^-$ by carboxylate anion along with the formation of HF. The nanometer-sized $(nBu_4N)_2$ $[Mo_6Br_8F_6]$ cluster unit was obtained by reaction of the $(nBu_4N)_2[Mo_6Br_{14}]$ precursor with an excess of $(nBu_4N)F$ in a mixture of acetone/ethanol. Owing to its bulkiness and to its octahedral coordination, a strategy based on the grafting of mesomorphic promoter through a flexible aliphatic spacer was used that in previous studies was successfully applied to obtain thermotropic mesophases in the case of polyoxometallate, octahedral coordination complexes, fullerene or bulky lanthanidomesogenes. The ligands $HL2^{a,b}$ are based on a gallic acid scaffold and were synthesized according to reported procedure in Kouwer, et al. The hybrids were easily obtained by heating a mixture containing one equivalent of $(nBu_4N)_2[Mo_6Br_8F_6]$ and six equivalents of the corresponding gallic acid derivative.

Example 2

Thermal and Liquid Crystal (LC) Properties of $(nBu_4N)_2[Mo_6Br_8L^2_6]$-6HF

Figure 2:
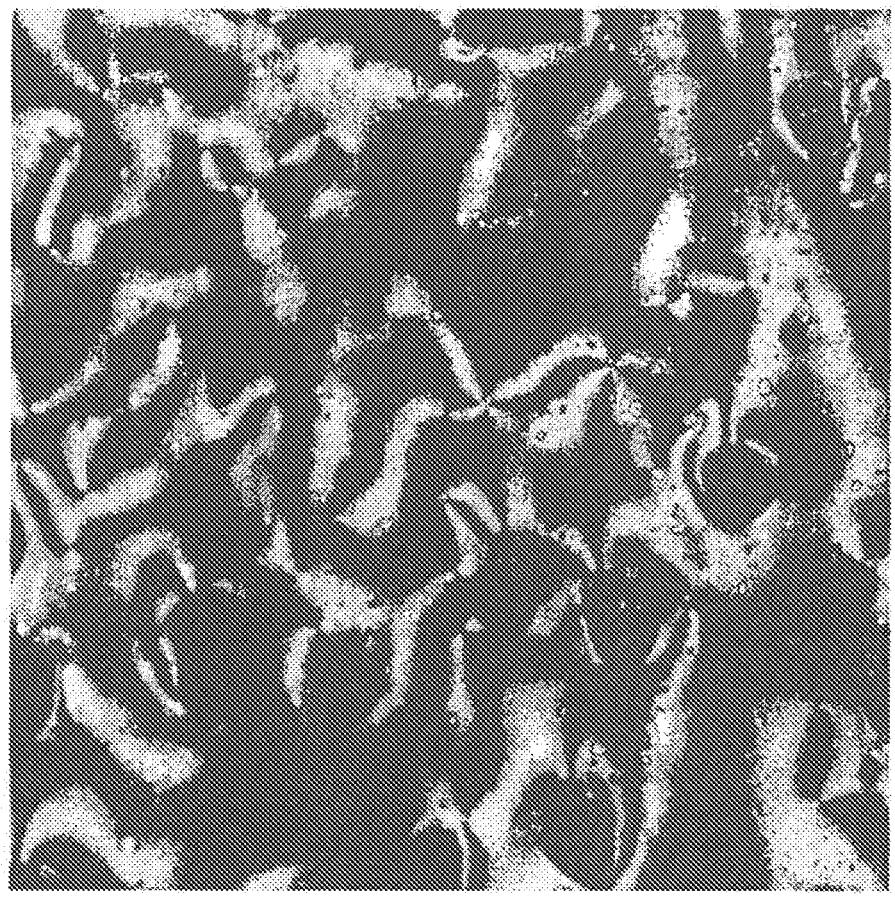
FIG. 2 depicts a polarized optical micrograph of $(nBu_4N)_2[Mo_6Br_8L^{2a}{}_6]$ at 87.5° C.
Figure 3:
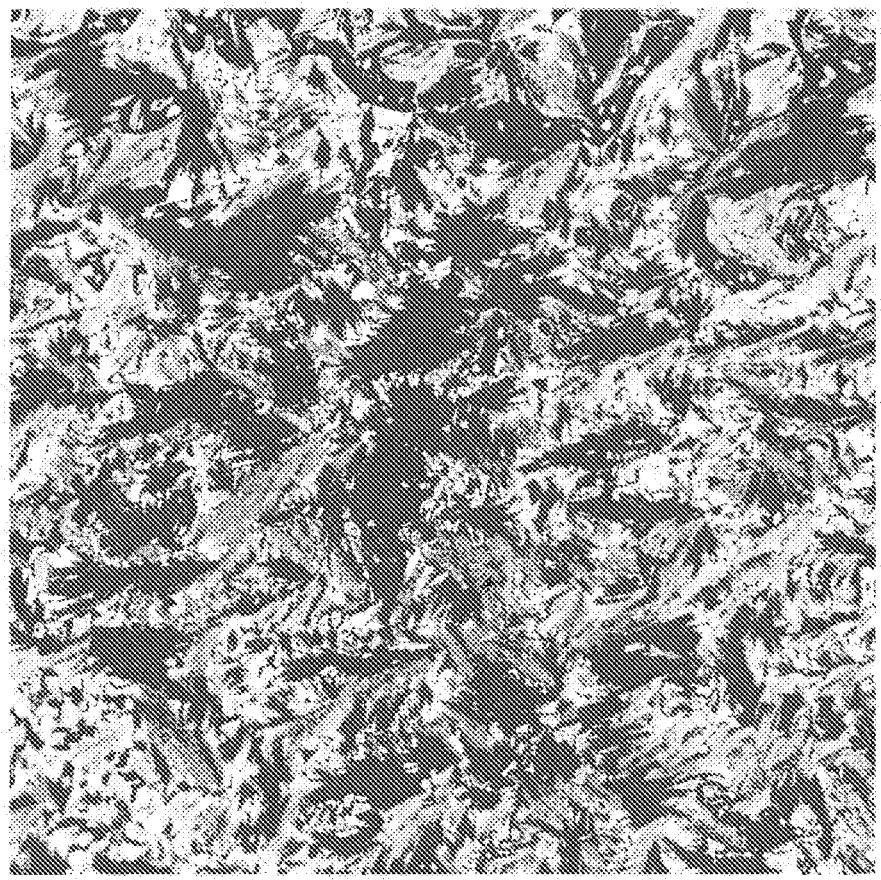
FIG. 3 depicts a polarized optical micrograph of $(nBu_4N)_2[Mo_6Br_8L^{2a}{}_6]$ at 77.5° C.
Figure 4:
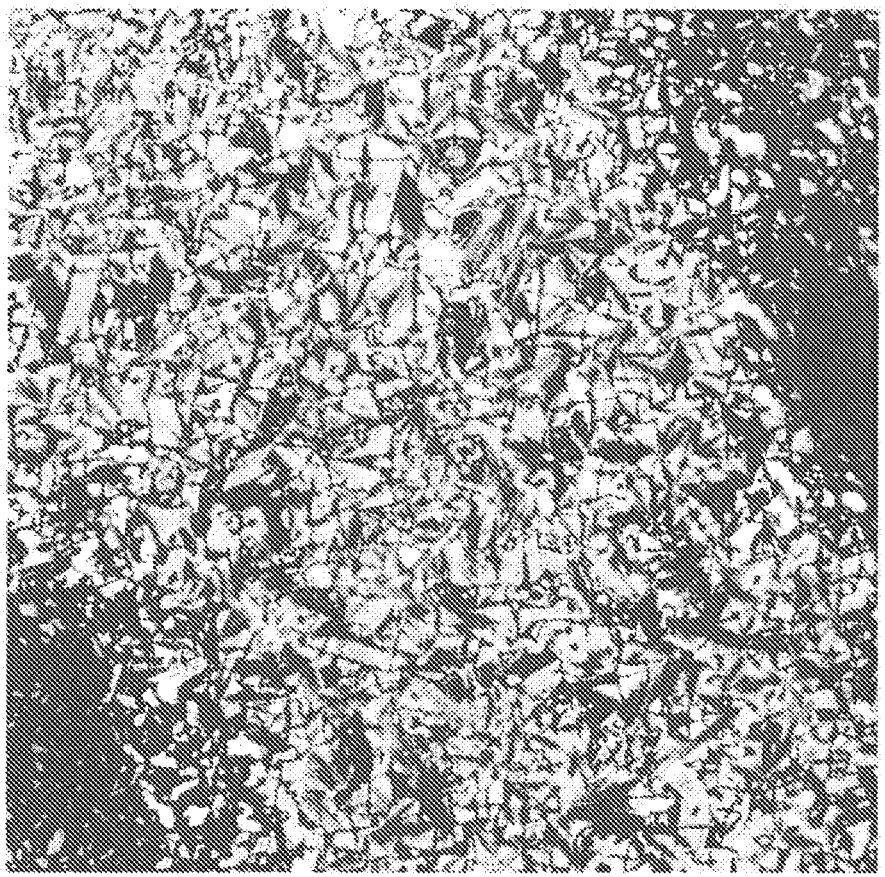
FIG. 4 depicts a polarized optical micrograph of $(nBu_4N)_2[Mo_6Br_8L^{2b}{}_6]$ at 104° C.

The thermal and liquid crystal (LC) properties of $(nBu_4N)_2[Mo_6Br_8L^2_6]$-6HF were investigated by differential scanning calorimetry (DSC), polarized optical microscopy (POM) and X-Ray diffraction. Polarized optical micrographs of $(nBu_4N)_2[Mo_6Br_8L^{2a}_6]$ at 87.5° C. and 77.5° C. and $(nBu_4N)_2[Mo_6Br_8L^{2b}_6]$ at 104° C. are shown in FIGS. 2 to 4. The phase transition and thermodynamic data are reported in the table in FIG. 5. In the case of $(nBu_4N)_2[Mo_6Br_8L^{2a}_6]$ a schlieren texture typical of nematic LC phase was observed from 94 to 82° C. followed by a Focal conic fans texture of smectic type phase until 20° C. on cooling from the isotropic melt. For $(nBu_4N)_2[Mo_6Br_8L^{2b}_6]$, focal conic fans textures of smectic type phase could be obtained by POM on cooling from the isotropic melt after two hours of annealing. The temperature ranges were confirmed by DSC analysis.

Example 3

Temperature Dependent X-Ray Diffraction

Figure 6:
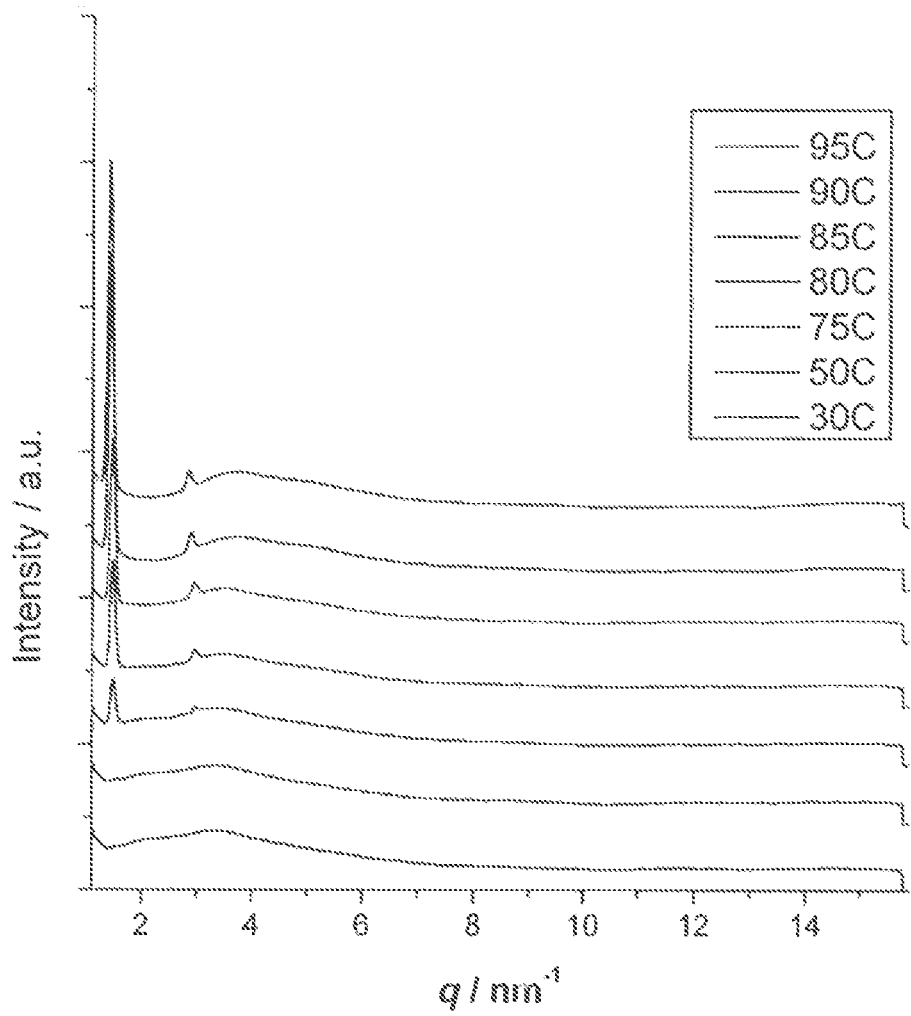
FIG. 6 shows the X-Ray diffraction pattern of $(nBu_4N)_2[Mo_6Br_8L^{2a}{}_6]$-6HF at 95, 90, 85, 80, 75, 50 and 30° C. obtained on cooling (plain line).
Figure 7:
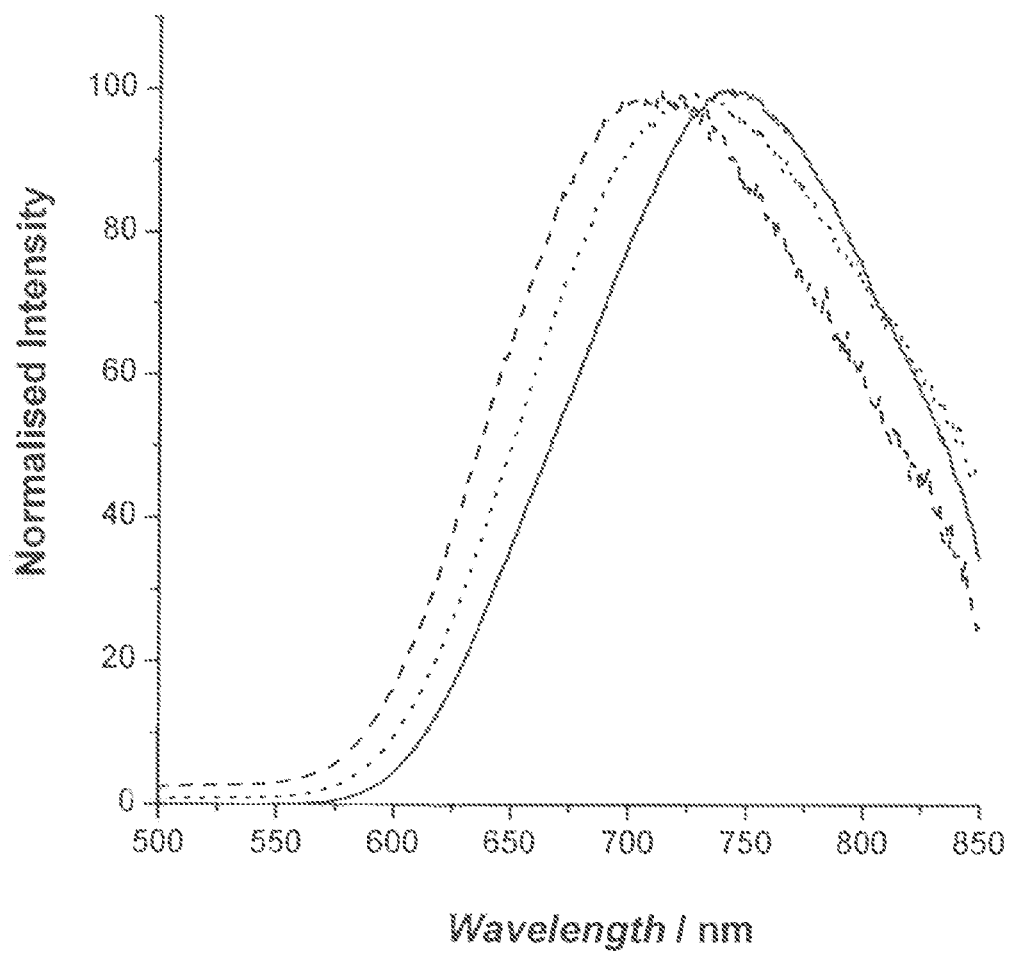
FIG. 7 illustrates corrected emission spectra of $(nBu_4N)_2[Mo_6Br_8F_6]$ (plain line), $(nBu_4N)_2[Mo_6Br_8L^{2a}{}_6]$-6HF (dashed line) and $(nBu_4N)_2[Mo_6Br_8L^{2b}{}_6]$-6HF (dotted line) in the solid state. $\lambda_{exc}$=450 nm. In the case of $(nBu_4N)_2[Mo_6Br_8F_6]$ the spectrum was taken on a powdered sample while for $(nBu_4N)_2[Mo_6Br_8L^{2a}{}_6]$-6HF and $(nBu_4N)_2[Mo_6Br_8L^{2b}{}_6]$-6HF, the samples were layered by spin coating on a silica substrate.

Temperature dependent X-ray diffraction experiments were carried out to identify the exact nature of the obtained mesophase. The X-ray diffraction patterns recorded at different temperatures within the mesomorphic range are all qualitatively equivalent and contain two sharp small angle reflexions characteristic of a layered morphology with a reciprocal spacing in the 1:2 ratio. Thus, by applying the Bragg's law, for example at 80° C., a spacing of 42.2 Å attributed to the interlayer distance was calculated. A diffuse scattering halo in the wide angle region centered around 4.4 Å (h1) and corresponding to the lateral short range order of the molten chains and the cyanobiphenyl moieties confirmed the liquid crystalline nature of the mesophase. Additional intense and very broad reflections are attributed to the average lateral organization of the electron rich cluster cores—within the layers. FIG. 6 shows the X-Ray diffraction patterns of $(nBu_4N)_2$ $[Mo_6Br_8L^{2a}_6]$-6HF at various temperatures obtained on cooling.

Example 4

Emission Measurements

Emission measurements were carried out for all compounds in the solid state (on powder for $(nBu_4N)_2[Mo_6Br_8F_6]$ and on a sample deposited by spin coating on a silica glass slide for $(nBu_4N)_2[Mo_6Br_8L^2_6]$). As depicted in FIG. 5, all clusters show a broad luminescence in the red-NIR area from 570 to more than 900 nm with a maximum located at 745 nm for $(nBu_4N)_2[Mo_6Br_8F_6]$, 710 nm for $(nBu_4 N)_2$ $[Mo_6Br_8L^{2a}_6]$ and 735 nm for $(nBu_4N)_2[Mo_6Br_8L^{2b}_6]$. This luminescence is obtained for a wide range of excitation wavelength from 300 nm to 550 nm. The presence of the ligand around the cluster induces slight changes on its luminescence spectra revealing that the electronic transition responsible of the emission is mainly of metal-metal charge transfer type and therefore that the bright luminescence properties are preserved upon complexation.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are merely set forth for a clear understanding of the principles of the disclosure. Many variations and modifications may be made to the above-described embodiments. All such modifications and variations are intended to be included herein within the scope of this disclosure and protected by the following claims.

Therefore, at least the following is claimed:

1. A compound having a M6 based cluster core, wherein M is selected from Molybdenum (Mo) or Tungsten (W), and at least one ligand, wherein the ligand is a carboxylic acid compound having the following formula:

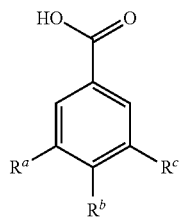

wherein $R^a$, $R^b$ and $R^c$ are

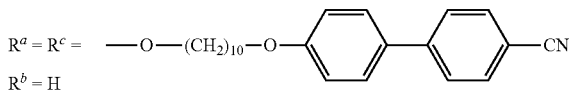

$R^a = R^c =$ —O—$(CH_2)_{10}$—O—...—CN
$R^b = H$ or, wherein $R^a$, $R^b$ and $R^c$ are

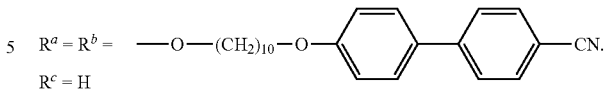

$R^a = R^b =$ —O—$(CH_2)_{10}$—O—...—CN.
$R^c = H$

2. A compound according to claim 1, wherein the $M_6$ based cluster core is of the $M_6Q_8L_6$ type, wherein each M is independently selected from Molybdenum or Tungsten, wherein each Q is independently selected from a halogen or a chalcogen, and L is a ligand.

3. The compound according to claim 2, wherein Q is selected from the group consisting of S, Se, Te, I, Cl, Br, and a mixture thereof.

4. The compound according to claim 1, wherein the luminescence of the compound is from about 550 to 950 nm.

5. The compound according to claim 4, wherein the luminescence maximum of the compound is located from about 700 nm to 745 nm.

6. A method of producing a compound according to claim 1 comprising a one step reaction of a metal cluster of the $M_6Q_8X_6$ type, wherein each M is independently selected from Molybdenum or Tungsten, wherein each Q is independently selected from a halogen or a chalcogen, and X is a F, with ligands.

7. The method according to claim 6, wherein Q is selected from the group consisting of S, Se, Te, I, Cl, Br, and a mixture thereof.

8. The method of claim 6, wherein the method is performed in ambient atmosphere.

9. The method according to claim 6, wherein the one step reaction is performed in an aprotic polar solvent.

10. The method according to claim 6, wherein the method is performed in the melted ligand.

11. A luminescent material with liquid crystalline properties comprising a compound according to claim 1.

12. The luminescent material with liquid crystal properties of claim 11, wherein the luminescence is from about 550 to 950 nm.

13. The luminescent material with liquid crystal properties of claim 12, wherein the luminescence maximum is located from about 700 nm to 745 nm.

14. The luminescent material with liquid crystal properties of claim 11, wherein the material remains in the smectic phase in a temperature from about 20° C. to 82° C. and shows a nematic phase of about 82° C. and 94° C.

15. An appliance comprising, luminescent material with liquid crystal properties according to claim 11, wherein the appliance is selected from the group consisting of display devices, polymeric matrix flat screens, LCD screens, photovoltaic cells, information storages, temperature detectors, gas sensors, electroluminescent diodes, LASERs, active waveguides, and field effect transistors.

* * * * *